Aug. 8, 1961 G. J. SELVIN 2,995,686

MICROELECTRONIC CIRCUIT MODULE

Filed March 2, 1959 3 Sheets-Sheet 1

INVENTOR.
GERALD J. SELVIN

BY Spencer E. Olson

ATTORNEY.

Aug. 8, 1961 G. J. SELVIN 2,995,686

MICROELECTRONIC CIRCUIT MODULE

Filed March 2, 1959 3 Sheets-Sheet 2

INVENTOR.
GERALD J. SELVIN

BY Spencer E. Olson

ATTORNEY.

INVENTOR.
GERALD J. SELVIN
BY
Spencer E. Olson
ATTORNEY

United States Patent Office 2,995,686

Patented Aug. 8, 1961

2,995,686

MICROELECTRONIC CIRCUIT MODULE

Gerald J. Selvin, Wayland, Mass., assignor, by mesne assignments, to Sylvania Electric Products Inc., Wilmington, Del., a corporation of Delaware Filed Mar. 2, 1959, Ser. No. 796,577
8 Claims. (Cl. 317—101)

This invention relates to electronic apparatus, and more particularly to the fabrication, stacking and interconnection of groups of electrical elements into assemblies known as modules. The invention is especially useful in the mechanized production of electronic equipment having high electronic component density and low weight and volume, commonly known as microminiaturized circuitry.

A principal object of the invention is to provide an improved composite electronic circuit component assembly or module.

Another object of the invention is to provide an electronic circuit module in which the circuit elements are hermetically sealed.

Still another object of the invention is to provide a microminiaturized circuit module in which individual circuit elements or sub-circuits within the module are shielded from each other, and different modules shielded from each other.

Another object of the invention is to provide an assembly of wafer circuit elements which is compact, rugged, and easily assembled.

Still another object of the invention is to provide an electronic circuit module wherein the need for wires for interconnection of individual circuit elements or sub-circuits, or groups of modules, is completely eliminated.

Briefly, the present module comprises a plurality of wafers, formed, for example, of a vitreous insulating material, such as ceramic, on which circuit elements or sub-circuits are applied, as by printing or evaporation techniques, or by physical attachment. The wafers are all of the same size and shape, preferably square, each provided on each of its edges with the same number of integral tabs. The terminals of the circuit elements on a wafer are conductively connected to selected ones of the tabs on the wafer, the selected tabs being rendered conducting, as by plating with a suitable metal. A single wafer may have but one circuit element thereon, or from one to four interconnected circuit elements, whereby each wafer has two, three or more terminals requiring connection to another circuit element or sub-circuit. By judicious selection of tabs, the terminals, and hence the external wiring between tabs, can be adequately physically separated.

A group of wafers, having the necessary circuit elements thereon to form, when connected, a required circuit, are stacked one on the other and spaced apart with spacer frames of sufficient thickness to separate the circuit elements on each wafer from the next adjacent wafer. During the stacking of the wafers and spacer frames, the frames are bonded to the wafers so as to hermetically seal the circuit elements from the outside environment, and to form a rigid, self-supporting assembly.

All of the wafers contain the same number of tabs on each edge, which are similarly spaced along the edges, and the active conductive tabs on the wafers are interconnected by an insulating interwiring board such as a ceramic which engages and makes electrical contact with the projecting tabs. The interwiring board is formed with a plurality of slots spaced to receive the tabs extending from one edge of the stack, with selected slots interconnected with printed wiring to interconnect the active tabs on the wafers. The wafers and spacer frames are of standard thicknesses, permitting fabrication of the interwiring boards as a family of standard units with only the printed wiring between slots modified to suit the interelement wiring requirement. The active conductive tabs on the wafer elements fit through the active slots in the interwiring board, which are also plated or coated with a conductive material, and the final connection between wafer tab and interwiring board is made by conventional manual soldering, dip soldering or other suitable joining techniques. Depending upon the nature of the circuit constituted by the module, one, two, three or four separate interwiring boards may be required to make the necessary interelement connections.

Other objects, features and advantages of the invention will become apparent, and a better understanding of its organization will be had, from the following detailed description, taken in conjunction with the accompanying drawings, in which.

Figure 1:
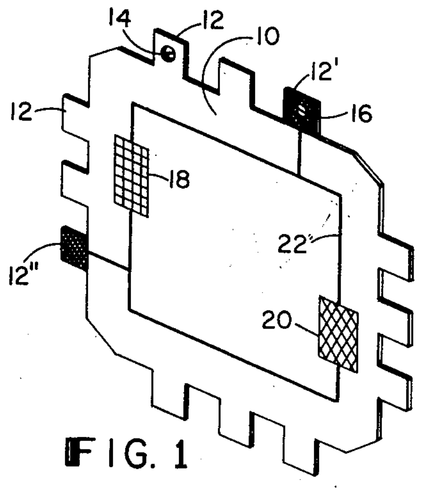
FIG. 1 is a perspective view of a preferred form of a wafer element which forms part of the module of the invention.

Referring now to the drawings, FIG. 1 illustrates a typical wafer element, or a substrate, on which the circuit elements are supported. The wafer element is shown greatly enlarged in the drawing, typical dimensions for the element being 0.5 x 0.5 in. with a thickness of 8 to 12 mils, a "mil" being understood to mean a thousandth of an inch. The wafer 10 is formed of a rigid insulating material, preferably vitreous materials, such as alumina or glass, or it may be formed of any of the many available phenolic and epoxy resins. High density, high purity aluminas, such as #AD-99 available from the Coors Manufacturing Company, or Al Si Mag #652 or #614, available from the American Lava Company, are particularly satisfactory. Certain glasses are also satisfactory for the fabrication of the wafer element, such as Corning #7070, a borosilicate glass, or Corning #7900, a high silica glass, both available from the Corning Glass Company. The wafers are formed by pressing and firing by techniques known to the art, and initially are complete insulators; that is, the wafers are formed entirely of the ceramic or glass material and have no conductive portions thereon.

Each of the wafers is formed with an equal number of integral tabs 12 which project from the edges of the wafer in the plane of the wafer itself. For a wafer which is one-half inch square, it has been found that three tabs along each edge provides adequate separation of electrical connections to the tabs, and permits convenient assembly and interconnection of a plurality of wafer elements. In a typical wafer element, each of the tabs is about 50 mils wide and projects from the edge of the board about 25 mils. Small holes through the wafer element may be provided at 14 and 16 for the purpose of mechanically identifying and positioning the wafer elements in mechanical assembly operations, or to provide means for interconnecting the circuit elements on the wafer with wires, which may conveniently be inserted through these holes. It is contemplated, however, that the interwiring of circuit elements be accomplished entirely without the use of wire as will be seen hereinafter.

In order that a circuit module, that is, a stack of wafers and spacer elements, constitute an operative circuit, each of the wafer elements carries or supports an electrical circuit element or component, or a functional sub-circuit, which is subsequently interconnected with similar circuit elements on other wafers. For example, a single wafer may carry a single functional resistance-capacitance portion of a circuit, an inductance-capacitance portion of the circuit, or a resistor-diode portion of the circuit, to provide electrical circuit characteristics rather than individual part characteristics. Techniques are now available for printing, etching, plating, or otherwise depositing circuit elements, such as resistors, capacitors, inductances and semiconductor diodes and transistors directly onto a ceramic or glass substrate. In the present state of the printed components art, it is feasible to place two, and probably more than four circuit elements on a one-half inch square wafer, thus permitting the placement of a relatively complex sub-circuit on an individual wafer. The method of placing these circuit elements on the ceramic substrate forms no part of the present invention; suffice it to say that techniques are available for placing such elements on the wafer element. FIG. 1 diagrammatically illustrates a two element circuit placed on wafer 10, which may consist of a resistor 18 and a capacitor 20 interconnected by printed or plated interwiring connections 22 to form an RC-combination. The terminals of this RC circuit are connected, by conductive paths applied to the substrate by printed circuit techniques, to selected ones of the tabs projecting from the edges of the wafer. In the illustrated example of a sub-circuit having two external terminals, one terminal is connected to tab 12' on the upper edge of the wafer, and the other is connected to tab 12'' projecting from one of the side edges of the wafer. The tabs selected as terminals are covered with a conductive coating, indicated by the cross-hatching, which, for example, may be silver printed on the tab and fired onto and into the substrate material. It will be appreciated that wafers having two interconnected circuit elements placed thereon may have two or three external terminals, depending upon the nature of the sub-circuit, and that when three or four elements are placed on one wafer three or four conductive tabs may be required for connection to other sub-circuits. FIG. 1, therefore, should be understood to be by way of example only, it being further understood that all of the terminals may be brought out to tabs lying along a single edge of the wafer and not necessarily from two edges as illustrated.

From the foregoing, it is seen that a plurality of the sub-circuits of the form shown in FIG. 1, each having a specific circuit configuration thereon, may be connected via their respective tabs to provide a complete electronic circuit. One of the problems, however, is to protect the individual electronic parts, each of which may be sensitive and fragile, from atmospheric contamination, corrosion, vibration and moisture. Heretofore, in the microcircuitry art, this has been done by the technique known as potting; that is, surrounding the electronic parts and filling the spaces between wafers with a suitable resinous compound. This technique has not been entirely satisfactory, inasmuch as many of the available potting materials interact with the materials used in placing the electronic part on the ceramic wafer. The interaction may be either a potting material solvent action, or actual chemical reaction. The effects may be particularly deleterious to semiconductor elements and uncased resistors and capacitors where many potting agents either alter or totally destroy the electrical functioning capability of the primary devices. In addition, most potting materials exhibit an exothermic action when setting. Also, most potting materials have varying and variable dielectric constants and their results and effects upon electrical circuit performance must be analyzed and known in every new condition. Finally, most potting materials have a slow cure time, and they obviously add weight and cost to the completed assembly.

Figure 2A:
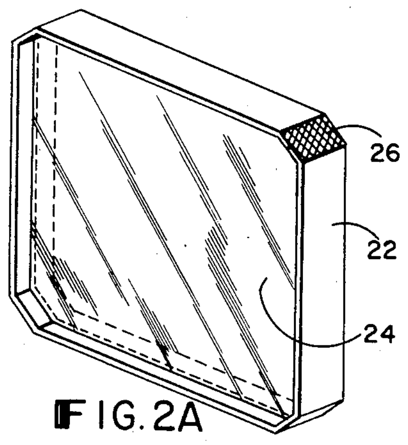
FIG. 2A is a perspective view of a spacer frame modified to provide electrical shielding.
Figure 2:
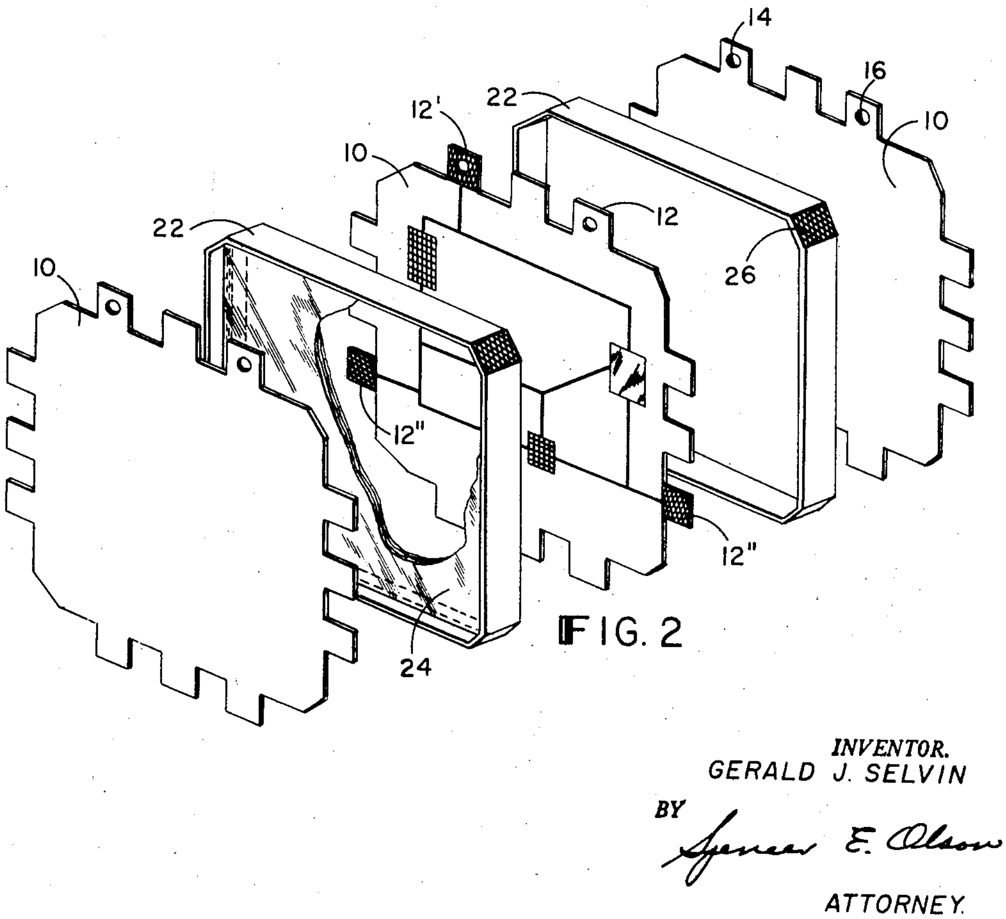
FIG. 2 is an exploded assembly view, in perspective, of wafer elements and spacer frames.

The novel method of the present invention of stacking and joining the wafer elements one to another provides protection for the elements on the wafers without the use of potting. As shown in FIG. 2, the wafers 10 are stacked one on top of the other and spaced from each other by spacing and sealing frames 22. The spacer frame is in the form of a thin ceramic or plastic hollow square, having peripheral dimensions corresponding to the nominal dimensions of the wafer elements. In other words, when a spacer frame is placed upon a wafer element, the tabs 12, in their entirety, project beyond the outer edge of the spacer frame. The wall thickness of the frame may be of the order of 10 to 30 mils, and the height, or stacking length, of the spacer frame may be any desired standardized dimension. Different circuit parts on the wafer elements may have different thicknesses, consequently requiring different spacing between some wafer elements than others, and accordingly, for reasons which will be more apparent later, the frames may have stacking lengths of 10, 30, 50 and 70 mils.

After a particular wafer element with its electrical components has been manufactured and tested electrically to assure its performance, the spacing ring 22 is bonded to its surface, in register with its edges, using either a minimal quantity of conventional plastic adhesive material, or a ceramic adhesive. When the sequence of circuit element stacking and orientation has been determined, a module is produced by bonding together a wafer element, seal ring, wafer element, seal ring, wafer element, etc., to form the total module. In this manner, the individual electrical components are hermetically protected from the outside environment and the circuit element stacks are rigidly bonded one to the other. Should it be necessary for improved performance of the circuit parts, the stacking operation may be performed in an inert atmosphere or vacuum whereby the spacers occupied by the circuit elements are evacuated or subjected to an inert gas. During the stacking operation, the spacing between the wafer elements is desirably controlled by means of an assembling tool to control the spacing between the tabs to insure the mating thereof with slots in a prefabricated interwiring board to be described.

Besides providing environmental protection to the electronic components, the sealing frame method of assembly affords another distinct advantage. Many circuit elements, particularly semi-conductor elements which can be expected to find widespread use in microminiaturized circuitry, are light-sensitive. The material of which the spacer frame 22 is formed is sufficiently opaque to optically isolate the circuit elements on the wafers. Many of the potting materials of the prior art did not afford this optical isolation.

A significant advantage provided by the sealing and spacing ring is that it can also be used as a mechanism for providing electrical shielding between the circuit elements on adjacent wafer elements. As shown in FIG. 2A, a plastic clad metal foil 24 may be fitted within the spacer frame 22, or affixed to one edge of the spacer frame. One corner of the spacer frame, as indicated at 26, may be metallized, as by firing printed silver onto and into the ceramic material, to which the foil 24 is conductively connected. Corresponding conductive corners 26 of all of the spacer rings having the foil 24 therein may then be connected together to act as an interstage grounding bus for the module. Alternatively, the spacer frame and window may be made completely of metal if the bonding material used to join wafer to wafer provides adequate insulation between the conductive paths from the circuit elements to the interconnection board, to be described.

By utilizing the above-described stacking and bonding technique, after each of the circuit elements is tested and its supporting wafer bonded to the spacing ring and then bonded to adjacent wafer elements, a recheck can be performed upon individual wafer element operation before the group of elements is electrically connected together. In other words, the technique permits quality control of the module at various stages in its fabrication thereby to minimize rejects and the cost of fabrication.

Figure 3:
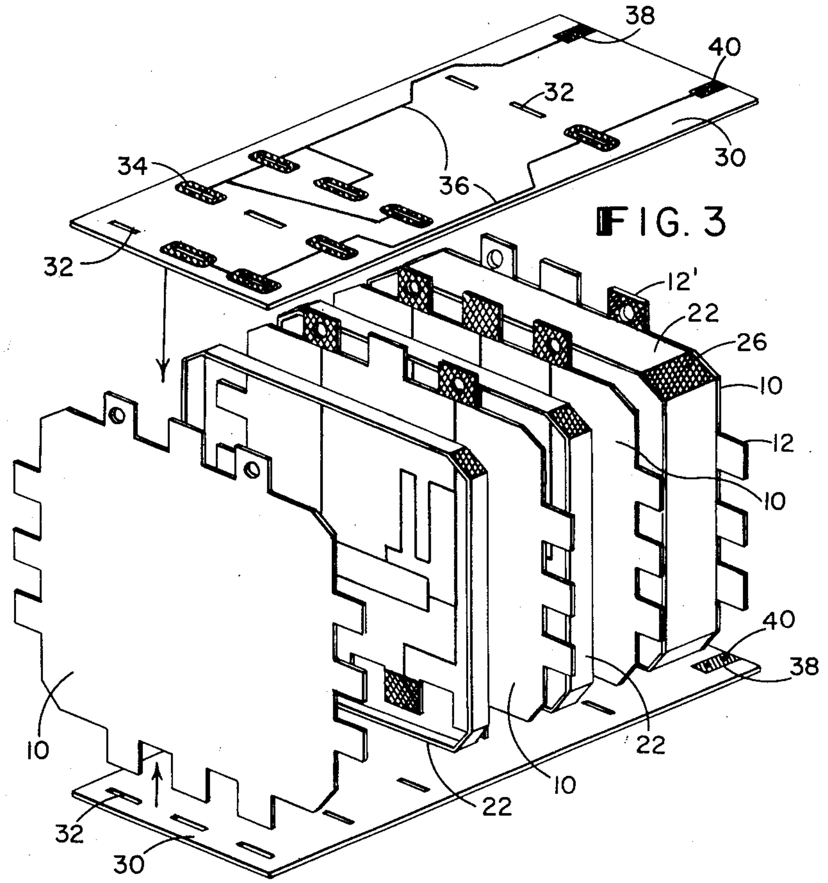
FIG. 3 is an exploded assembly view, in perspective, of wafer elements, spacer frames and two printed interwiring boards.

Following the stacking and bonding together of a selected group of wafer elements, the electrical parts of the wafer elements are connected together by one or more interwiring boards 30, as shown in FIG. 3. The interwiring boards are formed of ceramic, or glass, or any of the other materials of which the wafers might be formed, and have a generally rectangular shape and a thickness of about 20 mils. The board has a width corresponding to the length of one of the edges of the wafer element 10 and a length depending upon the number of wafer elements and spacing rings used in the fabrication of the module. The board 30 has a plurality of rectangular slots 32 therein spaced along the width dimension to register with the tabs on the wafer elements, and along the length dimension in accordance with the height of the spacing rings. The slots 32 are preferably uniformly spaced in three rows, with a spacing between slots, for the wafer element and spacer ring dimension mentioned earlier, of about 10 mils. It isn't necessary that each slot receive a tab, and the availability of slots at these spacings permit the selection of spacer frames of different stacking lengths, as required, from the prefabricated spacer frames having modular lengths. Selected ones of the slots 32 have a conductive material painted or fired thereon and therearound, as indicated at 34, and the thus activated slots are interwired by printed wiring 36, which may be silver printed and fired onto and into the ceramic on one surface thereof. The metallized tabs on the individual wafer element fit into the silvered or plated slots in the interwiring boards, bringing the two conducting silver surfaces together without the requirement for added pieces of wires. In some cases, the physical contact of the tabs with the conductive walls of the slots may be sufficient to make electrical contact, but the final connection between elements and the interwiring board is preferably made by conventional manual soldering or dip soldering, completely to fill the space between the tab and the edges of the slot. Since all of the wafers in the assembly contain the same number of tabs on each edge, the basic ceramic interwiring board can be fabricated as a family of standard units (that is, standard width and length and slot spacing) with only the printed wiring between slots modified to suit the interelement wiring requirement.

It will be observed that depending upon the nature of the electrical parts, or sub-circuits, on the wafer elements, and the selection of tabs for bringing out the terminals of such parts or sub-circuits, it may be possible to interconnect the elements of the module with a single interwiring board 30. On the other hand, complex circuits, or circuits requiring maximum physical separation of signal and power leads, may dictate the utilization of active tabs on opposite edges of the wafer element, thus necessitating the use of two interwiring boards as shown in FIG. 3. Other applications may require a third or even a fourth wiring board to complete the connections of the wafer elements of the module. The ceramic wafers and interwiring boards have efficient heat conductive properties and consequently are effective to conduct and distribute heat from the active electrical elements to the outside environment.

The above-described assembly of circuit elements and interconnections lends itself to the convenient application of additional protective or shielding coverings. For example, the entire assembly may be covered with a conformal coat of insulating material, such as plastic or ceramic, to protect the printed interwiring board surface against abrasion, moisture and/or corrosion. The entire assembly, with the insulating film thereon, may be further coated with a conductive material to provide the effect of a shielding can around the module. The conductive coating may be applied by dipping in a conductive paint, by evaporating or spraying a metal film onto the assembly, by wrapping with a conductive tape or foil, to name a few possibilities. The outer conductive film may be electrically connected to one of the external conductive areas on the interwiring board for attachment to a common ground on the balance of the structure.

It may be necessary, of course, in the building of complex circuitry, to interconnect one or more of the modules just described, and in keeping with the general objective of eliminating the use of wire for interconnection, the present invention affords the possibility of employing a number of alternative unique methods of interconnection. As shown in FIG. 3, the printed wiring may be terminated at the right end of the circuit board in conductive areas 38 through which one or more openings 40 may be formed, these openings extending through the ceramic board. This form of termination permits the utilization of a variety of interconnecting techniques, three possibilities being shown in FIGS. 4, 5 and 6.

Figure 4:
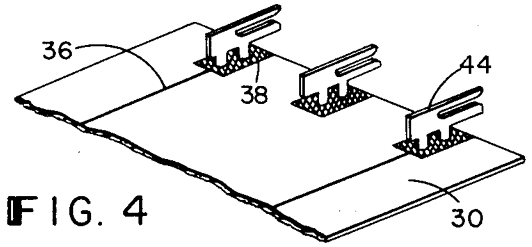
FIGS. 4, 5 and 6 are fragmentary views of one of the end surfaces of the interwiring board illustrating alternative methods of interconnecting circuit modules.

As shown in FIG. 4, spring connectors 44, of a form known to the art, are mechanically joined to the board 30 by prongs extending through the openings 40, and make electrical contact with the conductive areas 40. The fingers of the connector elements 44 engage a mating terminal on an adjacent board thereby to electrically connect two modules together. It will also be understood, that such connectors may be used to connect the module, or a group of modules, to other equipment wiring or connectors.

Figure 5:
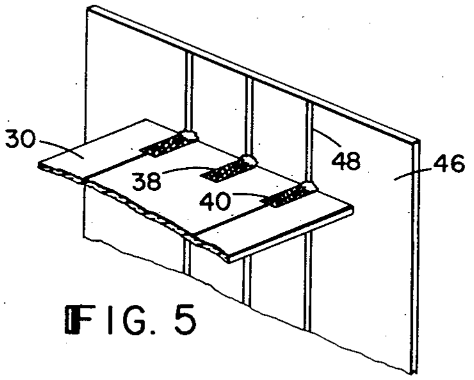

Should it be desirable to connect the interwiring board of a module directly to another printed wiring board, the circuit board termination shown in FIG. 3 permits the direct soldering to printed wiring on another board. As shown in FIG. 5, a board 46 to which connection is to be made may have printed wiring 48 thereon spaced so as to be in register with the conductive areas 40 on the interwiring board 30. In this case, the interwiring board 30 is abutted against the board 46 and the conductive areas 40 directly soldered to the printed wiring 48. In certain applications, it may also be desirable to provide means for mechanically securing the two boards together, in addition to that afforded by the solder connection. For example, slots or cutouts may be provided in the printed wiring board 46 for engaging the interwiring board 30 of the module to provide mechanical support.

Figure 6:
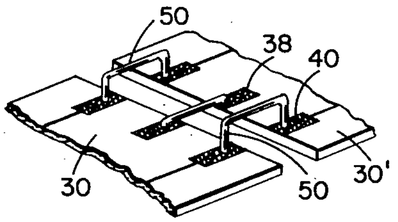

Finally, as shown in FIG. 6, two interwiring boards 30 and 30′ may be connected together by jumper clips 50 inserted in the openings 40 of the two boards and thereafter soldered to the conductive areas 38.

Figure 7:
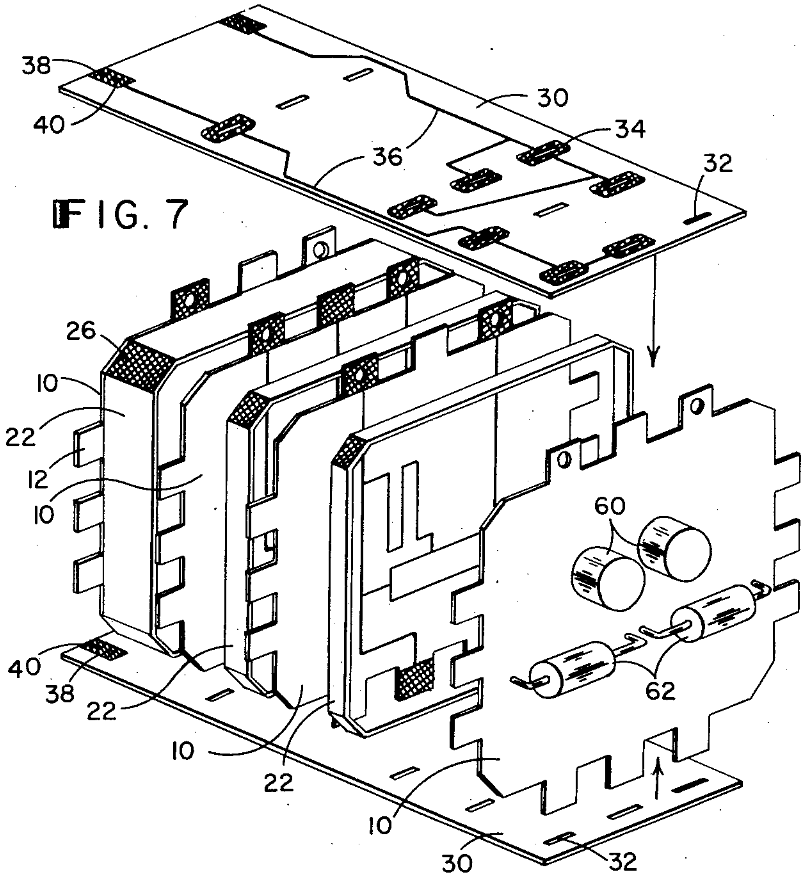
FIG. 7 is an exploded assembly view, in perspective and partially in phantom, illustrating the mounting of conventional cased circuit elements on wafer elements.

Inasmuch as the art of printed circuit parts is constantly changing, and since most parts having the requisite reliability are not yet available, it is desirable that the module construction permit the use of existing conventionally cased electrical components, such as transistors and diodes. How the module according to the present invention permits this is illustrated in FIG. 7. Such elements as cannot be contained within the space defined by the spacer frames, such as cased transistors 60 or standard diodes 62 may be physically attached to the end wafer element 10 of the module. These elements being already hermetically sealed, do not suffer by reason of being located outside the otherwise hermetically sealed module. The leads from such circuit elements are passed through small holes in the wafer and soldered to selected conductive paths on the wafer to permit interconnection to the balance of the wafer components and interconnection with other wafer elements of the module. Then, should these electronic parts become available as printed elements, they can be printed on a wafer, and this wafer substituted for the one carrying the standard conventional parts, without disturbing the design or fabrication procedure of the balance of the module.

From the foregoing, it is seen that applicant has provided a microminiaturized electronic circuit module of relatively simple, compact and rugged design. The individual circuit elements of the module are hermetically sealed from the outside environment and to some extent from each other, and electrically shielded from each other, and the hermetic seal also affords optical isolation of the circuit parts. The wafer elements, spacer frames, and interconnecting boards are of standard shape and design, providing precision, speed and economy in the manufacture of these basic structural parts, and simplifying the assembly operation involved in the fabrication of the module.

What is claimed is:

1. An electronic circuit module comprising, a plurality of wafer elements formed of insulating material arranged parallel to each other and each supporting at least one circuit element, said wafer elements having integral tabs projecting from at least one edge thereof in the plane of the wafer element, selected ones of the tabs on each wafer element having a conductive surface thereon electrically connected to the circuit element on that wafer element, a plurality of frames arranged alternately between wafer elements and each bonded to the adjacent wafer elements, and means for interconnecting the circuit elements on said plurality of wafer elements comprising at least one board formed of insulating material having slots therein into which the tabs projecting from the said one edge of all of said wafer elements are inserted, those slots receiving tabs having a conductive surface having a conductive coating therearound and electrically and selectively connected together by conductive paths formed on said board.

2. An electronic circuit module comprising a plurality of like wafer elements formed of rigid insulating material having a plurality of similarly arranged integral tabs projecting from at least one edge and lying in the plane thereof, at least one circuit element placed on a surface of each of said wafer elements, a conductive surface on selected ones of the tabs on each wafer element electrically connected to the circuit element on that wafer element, a plurality of rectangular frames alternately arranged with said wafer elements and sealed thereto insulatingly spacing said wafer elements apart and hermetically sealing said circuit elements, and at least one interwiring board, for said one edge of said wafer elements, having slots formed therein into which the tabs projecting from said one edge of the wafer elements are inserted, those slots receiving tabs having a conductive surface having therearound a conductive surface arranged for electrical connection to the conductive surface on the tabs, said board having conductive paths thereon selectively interconnecting the conductive surfaces around said slots for electrically interconnecting said circuit elements.

3. A miniaturized circuit module comprising, a plurality of thin rectangular wafer elements formed of insulating material each having a plurality of similarly arranged and shaped integral tabs projecting from the edges thereof, electric circuit elements supported on at least one of the flat surfaces of said wafer elements, said wafer elements having conductive paths thereon making electrical connection from the electric circuit elements thereon to selected ones of said tabs, a plurality of rectangular frames alternately arranged between wafer elements and bonded thereto for securing said wafer elements together in spaced parallel relationship, said tabs extending beyond the outer periphery of said frame, and at least one interwiring board formed of insulating material and having slots therein into which the tabs projecting from one edge of the spaced wafer elements are inserted, those slots receiving tabs having conductive paths thereon connected to electric circuit elements having therearound a conductive surface arranged for electrical connection to the conductive path on the tab, said board having conductive paths thereon selectively interconnecting the conductive surfaces around said slots for electrically interconnecting said electrical circuit elements.

4. A miniaturized circuit module comprising, a plurality of thin rectangular ceramic wafer elements each having a like number of similarly shaped and spaced tabs projecting from the edges thereof, electric circuit elements on at least one flat surface of each of said wafer elements, a conductive surface on selected ones of said tabs, conductive paths on each of said wafer elements electrically connecting the electric circuit elements thereon to the conductive surface on said selected tabs, a plurality of rectangular ceramic spacer frames alternately arranged between wafer elements and bonded thereto to secure said wafer elements together in spaced parallel relationship and to hermetically seal said electric circuit elements, and means for interconnecting the electric circuit elements on said wafer elements to provide a functional circuit including at least one thin, flat ceramic board having slots therein into which the tabs projecting from a common edge of all of said wafer elements are inserted, those slots receiving said selected ones of said tabs having therearound a conductive surface electrically joined to the conductive surface on the tabs, and conductive paths on said board selectively and electrically interconnecting the conductive surfaces around said slots.

5. The module in accordance with claim 4 and including a conformal coating of insulating material.

6. The module of claim 5 and including a conformal coating of conductive material exteriorly of said coating of insulating material for providing electric shielding of said electric circuit elements.

7. A miniaturized circuit module comprising, a plurality of thin rectangular ceramic wafer elements each having a like number of similarly shaped and spaced tabs extending from the edges thereof, selected ones of the tabs on one or more edges of each wafer element having a conductive surface thereon, at least one electric circuit element supported on a flat surface of each of said wafer elements, conductive paths on each of said wafer elements electrically connecting the electric circuit element thereon to the conductive surface on the selected tabs on that wafer element, a plurality of rectangular ceramic spacer frames alternately arranged with said wafer elements and bonded thereto to secure said wafer elements together in spaced parallel relationship as a unitary assembly and to hermetically and optically seal said electric circuit elements from the outside environment, sheets of metal foil mounted in selected ones of said spacer frames to afford electric shielding between electric circuit elements on adjacent wafer elements, and means for interconnecting the electric circuit elements on said wafer elements and for connecting the module to other modules or circuitry including at least one thin flat sheet of insulating material having slots therein into which the tabs projecting from a common edge of all of said wafer elements are inserted, those slots receiving said selected ones of said tabs having therearound a conductive surface electrically joined to the conductive surface on the tabs, conductive paths on said sheet selectively and electrically interconnecting the conducting surfaces around said slots, and connector means on at least one end of said sheet electrically joined to the conductive paths thereon.

8. An electronic circuit module comprising, in combination, a plurality of wafer elements formed of insulating material arranged parallel to each other and each supporting at least one circuit element, said wafer elements having integral tabs projecting from at least one edge thereof in the plane of the element, a plurality of frames having outside edges conforming with the edges of said wafer elements arranged alternately between wafer elements and each bonded to the adjacent wafer elements, said tabs projecting beyond said frames, and at least one board formed of insulating material joined to the said one edge of said wafer elements and having slots therein for receiving the tabs projecting from the said one edge.

References Cited in the file of this patent

UNITED STATES PATENTS

| | | |
|---|---|---|
| 2,786,969 | Blitz | Mar. 26, 1957 |
| 2,816,252 | Sanders | Dec. 10, 1957 |